United States Patent
Zhou

(10) Patent No.: US 7,974,679 B2
(45) Date of Patent: Jul. 5, 2011

(54) METHOD AND APPARATUS TO REDUCE IMAGE INTENSITY VARIATION DURING MR DATA ACQUISITION

(75) Inventor: Yong Zhou, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 2503 days.

(21) Appl. No.: 10/604,154

(22) Filed: Jun. 27, 2003

(65) Prior Publication Data

US 2005/0007110 A1    Jan. 13, 2005

(51) Int. Cl.
*A61B 5/055* (2006.01)
*G01V 3/14* (2006.01)
(52) U.S. Cl. .......... 600/410; 324/307; 324/309
(58) Field of Classification Search .......... 324/306, 324/307, 309
See application file for complete search history.

(56) References Cited

U.S. PATENT DOCUMENTS

| | | | | |
|---|---|---|---|---|
| 5,455,512 | A * | 10/1995 | Groen et al. | 324/309 |
| 5,713,358 | A | 2/1998 | Mistretta et al. | |
| 5,873,825 | A * | 2/1999 | Mistretta et al. | 600/410 |
| 6,198,959 | B1 * | 3/2001 | Wang | 600/413 |
| 6,380,740 | B1 | 4/2002 | Laub | |
| 6,483,307 | B2 * | 11/2002 | Ookawa | 324/309 |
| 6,815,952 | B1 * | 11/2004 | Rose et al. | 324/307 |
| 6,914,429 | B2 * | 7/2005 | Ookawa | 324/309 |
| 2001/0004211 | A1 * | 6/2001 | Ookawa | 324/309 |
| 2004/0061496 | A1 * | 4/2004 | Ookawa | 324/307 |
| 2004/0227510 | A1 * | 11/2004 | Rose et al. | 324/309 |
| 2005/0203377 | A1 * | 9/2005 | Watts et al. | 600/410 |

OTHER PUBLICATIONS

Stephen J. Riederer et al., 3D contrast-enhanced MR angiography using fluoroscopic triggering and an elliptical centric view order, Apr. 1999, International Journal of Cardiac Imaging, vol. 15, Issue: 2; p. 117-129.*
Stephen J. Riederer, Current technical development of magnetic resonance imaging, Sep.-Oct. 2000, : Engineering in Medicine and Biology Magazine, IEEE, vol. 19 , Issue: 5, p. 34-41.*
Jezzard, Peter "Physical Basis of Spatial Distortions in Magnetic Resonance Images." in: Bankman, Isaac N., Handbook of Medical Imaging Processing and Analysis (San Diego, Academic Press, 2000), pp. 425-438.*
Zhou, Y. et al., "Time Resolved MRA With Eliptical Centric View Ordering", Proc. Intl. Soc. Mag. Reson. Med, 2001, vol. 9, p. 1948.
Korosec, F. et al., "Time-Resolved Contrast-Enhanced 3D MR Angiography", Magnetic Resonance in Medicine, 1996, vol. 36, pp. 345-351.
Daniel, B. et al., "Breast Diease: Dynamic Spiral MR Imaging", Radiology, 1998, vol. 209, pp. 499-509.

* cited by examiner

*Primary Examiner* — Long V Le
*Assistant Examiner* — Angela M Hoffa
(74) *Attorney, Agent, or Firm* — Ziolkowski Patent Solutions Group, SC

(57) ABSTRACT

The present invention provides a system and method of reducing image intensity variations during imaging acquisitions that utilize large encoding gradient pulses that are played out immediately before a center of k-space is sampled. The present invention includes an acquisition and sampling that implements a predetermined delay in sampling prior to sampling the center of k-space. The delay in sampling the center of k-space following sampling of a peripheral region of k-space maintains the steady state of the MR signal and reduces the image intensity variation caused by eddy current and gradient hysteresis. As such, the intensity variations throughout k-space may be reduced substantially and brought closer to the intrinsic noise level of the data acquisition.

18 Claims, 4 Drawing Sheets

METHOD AND APPARATUS TO REDUCE IMAGE INTENSITY VARIATION DURING MR DATA ACQUISITION

BACKGROUND OF INVENTION

The present invention relates generally to MR imaging and, more particularly, to a method and apparatus of reducing image intensity variation during MR acquisition of volumetric data during passage of an intravascular contrast agent. More specifically, the present invention relates to a method and apparatus of reducing intensity variations in a reconstructed image that result from relatively large gradients being applied across an imaging volume.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Time Resolved Imaging of Contrast Kinetics using Elliptical Centric View Ordering (ECTRICKS) is an imaging technique for MR angiography that combines variable rate k-space sampling and view sharing to acquire 3D volumetric data rapidly during the passage of a contrast agent through the vasculature of a patient. One advantage of ECTRICKS imaging is that arterial-venous separation as well as artifact suppression is improved in time resolved MR angiography and, in particular, angiographic images in carotid arteries and peripheral vessels. ECTRICKS imaging has recently been applied to monitor contrast uptake in cancer tissues, for example, in the breast. In this regard, it has been shown that analysis of the contrast uptake using compartment-based pharmacokinetic models may differentiate between cancerous tissues and healthy tissues. Further, the contrast uptake may also be analyzed to ascertain and differentiate between different types of cancers. While ECTRICKS provides improved temporal resolution when compared to multi-phase 3D fast gradient echo acquisition, eddy current and gradient driver hysteresis associated with large amplitude gradients used to acquire data for peripheral regions of k-space causes intensity variations.

Referring to FIG. 4, an ECTRICKS acquisition for a number of imaging frames 77 is shown wherein the MR signal for the center of k-space is sampled more frequently than for outer or peripheral regions of k-space. For example, k-space data 76 may be partitioned into four, but equivalently sized regions A-D. The regions are divided by elliptical contour lines that represent the distance to the center of k-space. Since most of the signal comes from the center of k-space, i.e. region-A, this region is sampled more frequently than peripheral regions B, C, and D. During image reconstruction, linear interpolation is typically implemented to synthesize missing regions at any given point in time. For example, to reconstruct volumetric images of time frame 13, the A-region at frame 13 is used, the linear interpolation (B') of B-regions at frames 12 and 18 is used for the missing B-region data, the linear interpolation (C') of C-regions at frames 8 and 14 is used for the missing C-region data, and the linear interpolation (D') of D-regions at frames 10 and 16 is used for the missing D-region data. It should be noted that it is customary for contrast enhanced MR angiography to acquire a non-contrast mask volume (frames 1-4) to enable complex subtraction during reconstruction thereby allowing for background subtracted vessel-only images 78 to be generated.

To acquire encoded data for the outer or peripheral regions of k-space (regions B-D in FIG. 4), phase/slice encoding gradient pulses of larger amplitudes are used relative to that used to acquire data for the center of k-space (region A). To generate the larger amplitude gradients, a larger amount of current is used during the acquisition of the outer regions compared to the current used for the inner regions. For example, a much larger current is used during acquisition of the D-region compared to that used for acquisition of the A-region. These relatively large amounts of current induce eddy currents that cause distortion when the MR signal is sampled for filling the center of k-space. As a result, complex effects appear on the image that include ghosting and image intensity changes.

As noted above, these image intensity variations may be caused by eddy current and gradient driver hysteresis associated with gradient pulses with large amplitudes used to acquire data for peripheral regions of k-space. With ECTRICKS acquisition the center of k-space is collected or sampled immediately after each sampling of a non-center of k-space region, as illustrated in FIG. 4. The intensity variations in the center of k-space can be upwards of approximately 15 percent which is detrimental to analysis based on temporal intensity changes such as contrast uptake curve analysis. That is, the variation, which is a systematic variation, appears as part of the overall noise and thus introduces error in any index parameter that a model based approach would try to extract. Additionally, because of the complexity of the variation, it is difficult to alleviate this error using only post-processing techniques.

It would therefore be desirable to have a system and method capable of reducing image intensity variations during imaging acquisitions that employ large encoding gradients immediately prior to sampling of a center of k-space.

BRIEF DESCRIPTION OF INVENTION

The present invention provides a system and method of reducing image intensity variations during imaging acquisitions that utilize large encoding gradient pulses that are played out immediately before a center of k-space is sampled overcoming the aforementioned drawbacks. The present invention includes an acquisition and sampling that implements a predetermined delay in sampling prior to sampling the center of k-space. The delay in sampling the center of k-space following sampling of a peripheral region of k-space maintains the steady state of the MR signal while reducing the effect from eddy current and gradient hysteresis. As such, the intensity variations throughout k-space may be reduced substantially and brought closer to the intrinsic noise level in the data acquisition.

Therefore, in accordance with one aspect of the present invention, a method of MR data acquisition includes sampling peripheral regions of k-space at a pre-selected temporal rate. Following sampling a peripheral region of k-space, the process includes waiting a predetermined period before sampling a next region of k-space. Both the center region and the peripheral regions are acquired according to a pre selected temporal rate in which the center region is acquired more frequently.

In accordance with another aspect of the invention, an MRI apparatus to reconstruct MR images of a subject with reduced image intensity variations within k-space is disclosed. The apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to segment k-space into a center region and a number of peripheral regions, and determine a distance of each peripheral region from the center region. The computer is further programmed to sample MR signal and fill the center region at a faster sampling rate than used to sample each peripheral region. The computer is also programmed to delay sampling of the MR signal to fill the center region as a function of the distance of an immediately preceding sampled peripheral region from the center region.

In accordance with another aspect of the invention, the invention is embodied in a computer program stored on a computer readable storage medium and having instructions which, when executed by a processor, cause the processor to partition k-space into a number of partitions, wherein one partition corresponds to a center of k-space and the other partitions correspond to peripheral regions of k-space. The instructions further cause the processor to determine a distance from the center of k-space for each peripheral region. The processor is caused to delay the sampling of the center k-space by a predetermined value that is a function of the distance an immediately preceding sampled peripheral region is from the center of k-space.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

A system is shown to acquire MR data of a subject and reconstruct an image of the subject from the acquired MR data such that intensity variations across k-space are minimized. While the present invention will be described with respect to an ECTRICKS acquisition of MR angiographic data, one skilled in the art will readily appreciate that the present invention is equivalently applicable with MR acquisitions that employ relatively large amplitude gradient pulses prior to sampling a center of k-space. Additionally, the invention may be implemented with imaging applications that utilize elliptic centric or centric encoding multi-phase time resolved techniques. Moreover, the present invention is applicable with gradient echo, spin-echo, fast spin echo, spiral, and the like imaging sequences.

Figure 1:
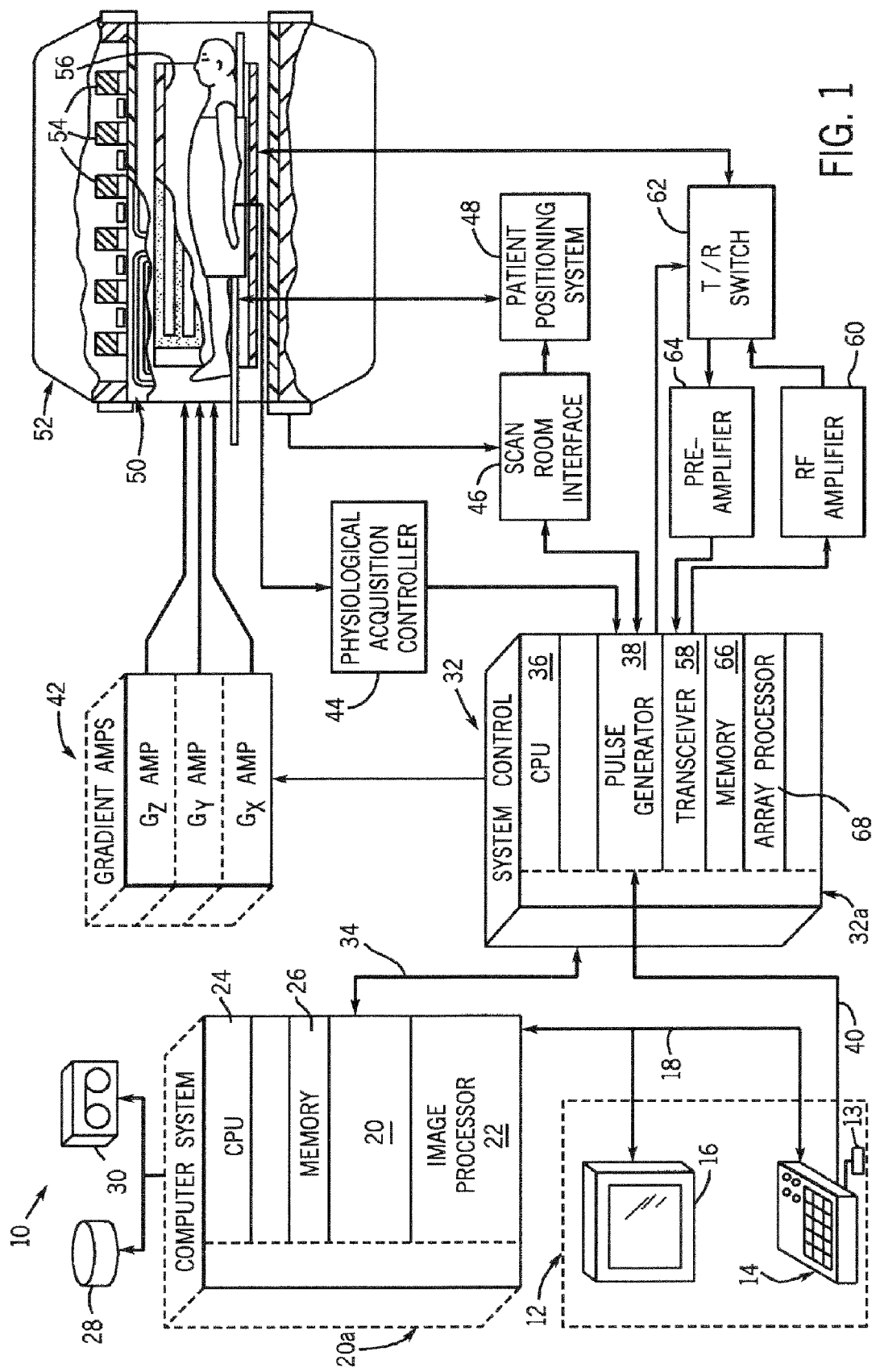
FIG. 1 is a schematic block diagram of an MR imaging system for use with the present invention.

Referring now to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
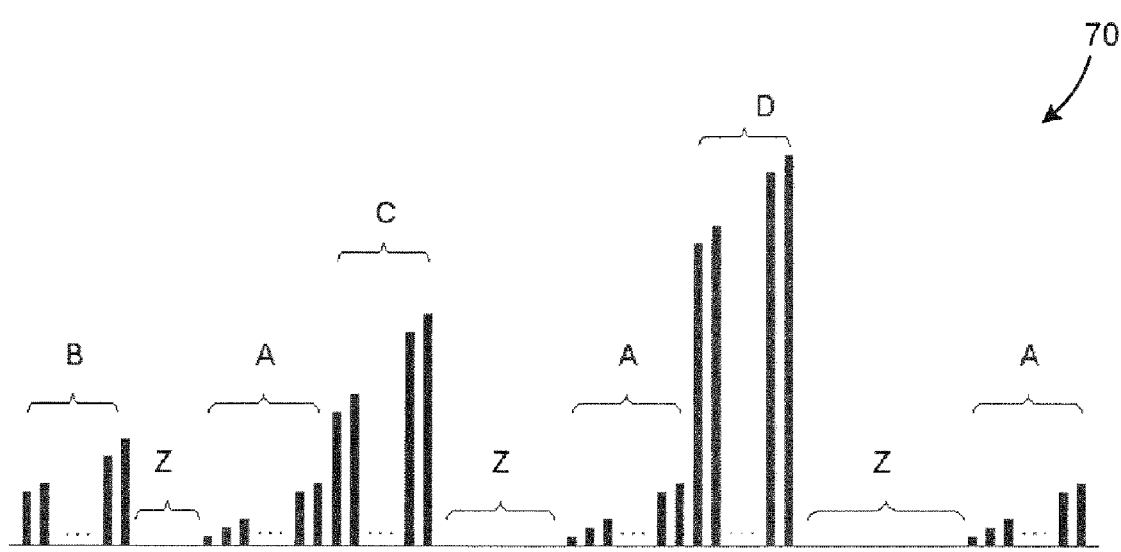
FIG. 2 is a schematic illustrating sampling order in accordance with the present invention.
Figure 4:
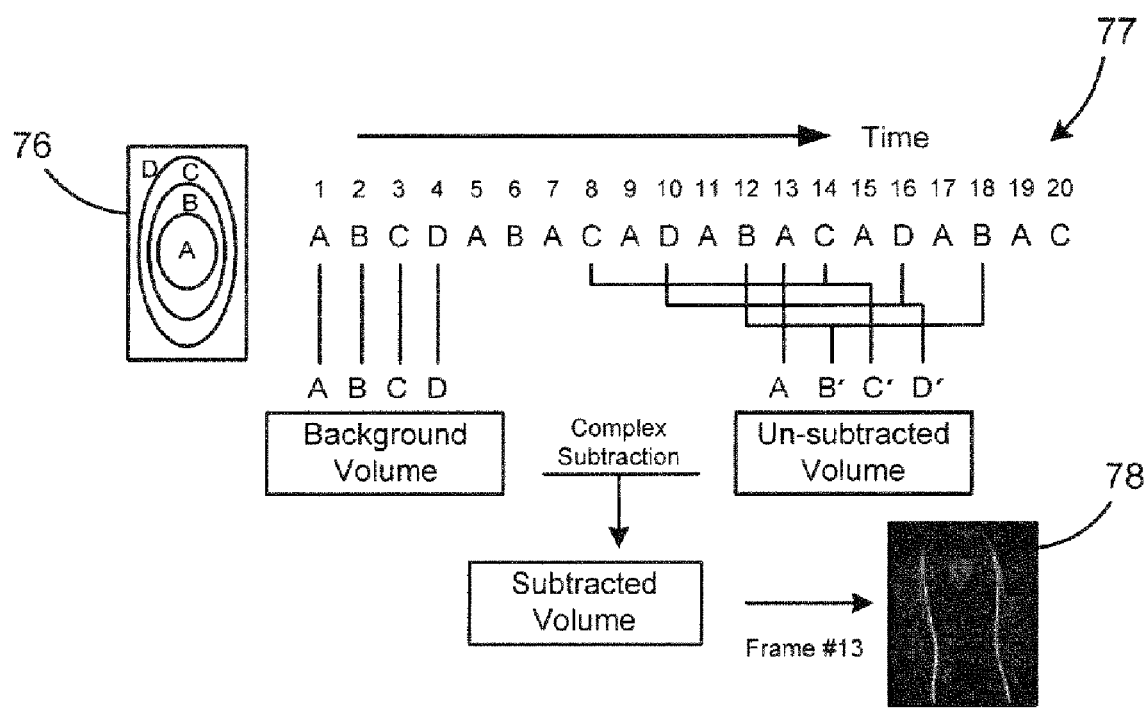
FIG. 4 illustrates a known ECTRICKS acquisition order.

Referring now to FIG. 2, sampling order 70 in accordance with one embodiment of the present invention is schematically illustrated. In the illustrated example, k-space is partitioned into four separate regions (A-D), similar to that shown in FIG. 4. As illustrated, region-A corresponds to the center of k-space and regions B through D extend concentrically around the center of k-space. In this regard, region-B is closer to the center of k-space than regions C or D and region-D is the farthest from the center or region-A. In the illustrated example, k-space has been partitioned into four separate and distinct regions; however, one skilled in the art would recognize that "four" illustrates only one partition example and, as such, k-space partitioning with more or less than four regions is contemplated and applicable with the present invention.

As further illustrated in FIG. 2, sampling order 70 implements a variable rate acquisition order to fill k-space. Specifically, the center of k-space or region-A is sampled at a faster rate than each peripheral region or regions B-D. In this regard, the center of k-space is sampled following each sampling of a peripheral region. As such, sampling of the center of k-space is interleaved within the sampling of the peripheral or non-center regions of k-space. As noted previously, ECTRICKS is one acquisition technique that implements a variable rate sampling and view order to acquire 3D volumetric data rapidly during passage of a contrast agent through a patient's vasculature. However, additional imaging techniques take advantage of variable rate sampling and thus may benefit from the present invention.

Still referring to FIG. 2, prior to each sampling of the center of k-space, a delay period, generally referenced Z, is observed. In other words, at least one zero-encoding pulse is played out prior to data acquisition for the center of k-space. The zero-encoding pulse is applied as either a slice encoding or a phase encoding gradient having a magnitude of zero which maintains the steady state of the signal while allowing the eddy current or gradient hysteresis effect to diminish. Alternately, the zero-encoding pulses may be applied with a low encoding, non-zero amplitude. This reduces the intensity variations in the final images to the intrinsic noise level of the acquisition. The zero-encoding pulse and the corresponding delay in sampling the center of k-space minimizes the effect eddy current and gradient driver hysteresis have on k-space, thereby improving the final reconstructed image. As such, employing zero-encoding pulses prior to the sampling of the center of k-space is not limited to ECTRICKS acquisition. The invention is also applicable with other acquisitions that utilize large phase or slice encoding gradient pulses prior to the sampling of the center of k-space.

As illustrated in FIG. 2, the length of the delay in sampling or number of zero-encoding pulse varies. Specifically, delay length or pulse number increases as the distance from the center of k-space of an immediately preceding sampled region of k-space increases. For example, in the illustrated sampling order 70, region-C is deemed closer to the center of k-space than region-D. Accordingly, the length of Z is greater after region-D than after region-C. Moreover, since region-B is deemed closer to the center of k-space than region-C, the delay period between acquisition of region-B and the center of k-space is shorter than the delay period between sampling of region-C and the center of k-space, region-A. It should be noted, that while not shown, RF and slice/slab selective pulses are applied throughout data acquisition to maintain generally steady-state conditions.

As previously stated, the length of the delay in the center of k-space sampling or the number of zero-encoding pulses depends on the prior region of k-space being sampled. In one embodiment, a linear approximation is used to determine the number of zero-encoding pulses to apply during data acquisition. For example, if five zero-encoding pulses are played out between acquisition of region-B and region-A then ten pulses would be played out between acquisition of region-C and region-A. Fifteen pulses would then be played out between acquisition of region-D and region-A. As such, the total number of zero-encoding pulses played out during one pass of sampling, in the illustrated example, would be thirty. The number of pulses to play out can be determined empirically, but a total or base number of thirty pulses has been shown to substantially reduce intensity variations to the basic noise level in the acquisition. One skilled in the art will appreciate that different scan parameters may require non-linear pulse values or a base value more or less than thirty. Further, one zero-encoding pulse represents a single unit of delay, therefore, multiplying the number of zero-encoding pulses between samplings by the single unit of delay equals the total delay in sampling time between sampling a peripheral region and sampling the center of k-space.

Figure 3:
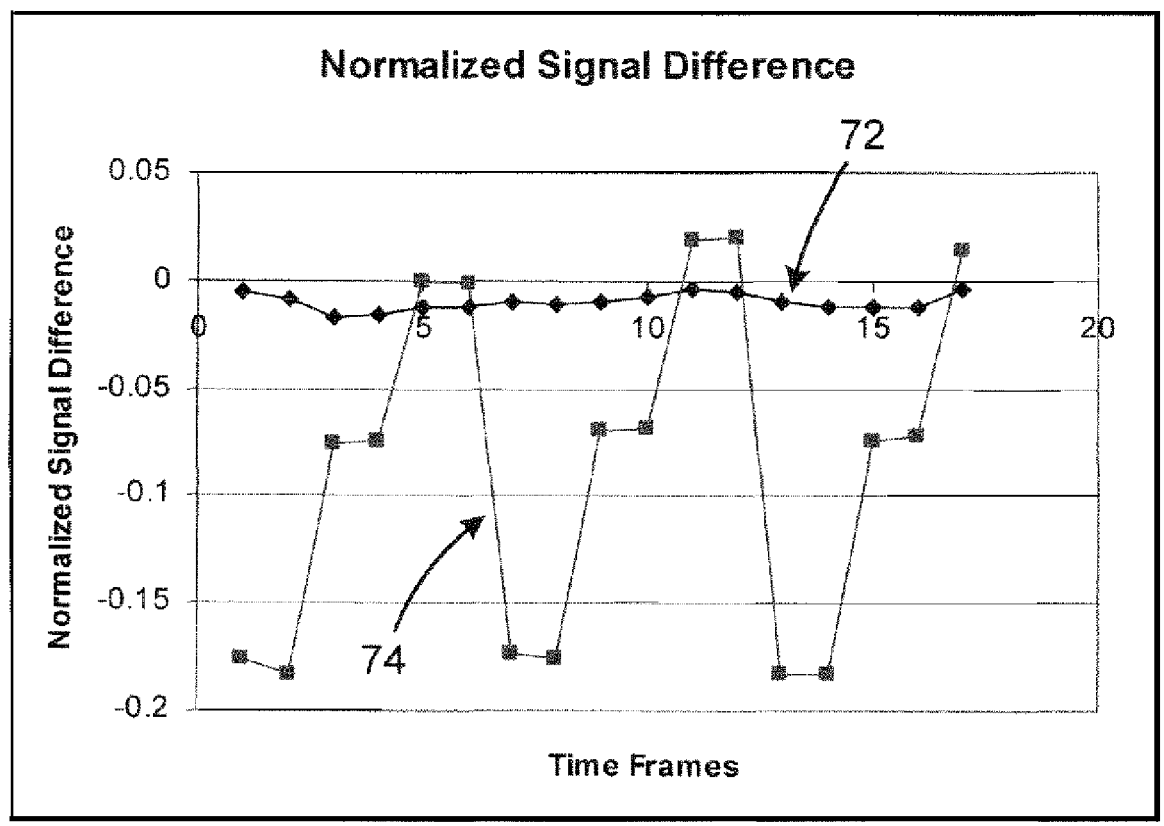
FIG. 3 is a graph comparing signal intensity of an exemplary ECTRICKS acquisition with signal intensity of a variable rate acquisition in accordance with one embodiment of the present invention.

Referring now to FIG. 3, a graph is shown illustrating intensity variations in accordance with the above described sampling and acquisition technique compared to an exemplary ECTRICKS acquisition. Curve 72 illustrates that signal intensity variation in accordance with the present invention varies slightly over time. Curve 74 illustrates signal intensity variation over time for an ECTRICKS acquisition. As is clearly shown, the signal intensity variation is significantly reduced with the normalized signal intensity variation experienced with the present invention as compared to the ECTRICKS acquisition.

Therefore, in accordance with one embodiment of the present invention, a method of MR data acquisition includes sampling peripheral regions of k-space at a pre-selected temporal rate. Following sampling a peripheral region of k-space, the process includes waiting a predetermined period before sampling a next region of k-space. Both the center region and the peripheral regions are acquired according to a pre selected temporal rate in which the center region is acquired more frequently.

In accordance with another embodiment of the invention, an MRI apparatus to reconstruct MR images of subject with reduced image intensity variations within k-space is disclosed. The apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to segment k-space into a center region and a number of peripheral regions and determine a distance of each peripheral region from the center region. The computer is further programmed to sample an MR signal to fill the center region at a faster sampling rate than used to sample each peripheral region. The computer is also programmed to delay sampling of the MR signal to fill the center region as a function of the distance of an immediately preceding sampled peripheral region from the center region.

In accordance with another embodiment of the invention, the invention is embodied in a computer program stored on a computer readable storage medium and having instructions which, when executed by a processor, cause the processor to partition k-space into a number of partitions wherein one partition corresponds to a center of k-space and the other partitions correspond to peripheral regions of k-space. The instructions further cause the processor to determine a distance from the center of k-space for each peripheral region. The processor is then caused to delay the sampling of the center k-space by a predetermined value that is a function of the distance an immediately preceding sampled peripheral region is from the center of k-space.

The present invention has been described in terms of the preferred embodiment, and it is recognized that equivalents, alternatives, and modifications, aside from those expressly stated, are possible and within the scope of the appending claims.

The invention claimed is:

1. A method of MR data acquisition comprising the steps of:
   interleaving sampling of peripheral regions of k-space and samplings of a center region of k-space, wherein performing the interleaved sampling comprises:
      sampling a first peripheral region of k-space at a pre-selected temporal rate;
      waiting a first predetermined period of time before sampling the center region of k-space, the center region being sampled at a faster temporal rate than the first peripheral region;
      sampling a second peripheral region of k-space at the pre-selected temporal rate; and
      waiting a second predetermined period of time different than the first predetermined period of time before sampling the center region of k-space, the center region being sampled at a faster temporal rate than the second peripheral region;
      wherein the first and second predetermined periods of time are a function of a distance of the respective first and second peripheral regions from the center region of k-space, and wherein the predetermined period of time increases as the peripheral region distance from the center region of k-space increases.

2. The method of claim 1 further comprising the step of maintaining steady state of the MR signal to minimize signal intensity variation.

3. The method of claim 1 further comprising the step of playing out a series of zero-encoding pulses during the predetermined period of time.

4. An MRI apparatus comprising:
   a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
   a computer programmed to:
      segment k-space into a center region and a number of peripheral regions;
      determine a distance of each peripheral region from the center region;
      sample an MR signal so as to fill each of the number of peripheral regions;
      sample an MR signal, subsequent to each sampling of a respective peripheral region, so as to fill the center region, wherein the center region is filled at a faster sampling rate than used to sample each peripheral region; and
      wherein each sampling of the MR signal to fill the center region is delayed as a function of the distance of an immediately preceding sampled peripheral region from the center region.

5. The MRI apparatus of claim 4 wherein the computer is further programmed to increase the delay in sampling as the distance of the immediately preceding sampled peripheral region from the center region increases.

6. The MRI apparatus of claim 5 wherein the increase in delay is a linear increase in delay time.

7. The MRI apparatus of claim 6 wherein the number of peripheral regions includes at least a first peripheral region and a second peripheral region, with the first peripheral region being closer to the center region than the second peripheral region, and wherein the delay in sampling observed after sampling of the second peripheral region is a multiple of the delay in sampling observed after sampling the first peripheral region.

8. The MRI apparatus of claim 4 wherein the computer is further programmed to play out a series of approximately zero-encoding pulses along one of a slice selective axis and phase-encoding axis during the delay in sampling.

9. The MRI apparatus of claim 8 wherein a number of approximately zero-encoding pulses in the series of approximately zero-encoding pulses increases as the distance of each peripheral region from the center region increases.

10. The MRI apparatus of claim 4 wherein the computer is further programmed to acquire 3D volumetric data during passage of an intra-vascular contrast agent through a patient.

11. A non-transitory computer readable storage medium having stored thereon a computer program to reduce image intensity variation during MR data acquisition, the computer program including a set of instructions that when executed by a processor causes the processor to:
   partition k-space into a plurality of partitions wherein one partition corresponds to a center of k-space and the other partitions correspond to peripheral regions of k-space;
   determine a distance from the center of k-space for each peripheral region;
   sample a peripheral region; and
   subsequent to sampling of the peripheral region, delay the sampling of the center of k-space by a predetermined value that is a function of the distance of the immediately preceding sampled peripheral region from the center of k-space.

12. The computer readable storage medium of claim 11 wherein the set of instructions further causes the processor to play out a number of minimal-encoding pulses prior to the sampling of the center of k-space.

13. The computer readable storage medium of claim 12 wherein the number of minimal-encoding pulses played out prior to sampling of the center of k-space increases as the distance from the center of k-space an immediately preceding peripheral region of k-space increases.

14. The computer readable storage medium of claim 13 wherein the number of minimal-encoding pulses varies linearly as a function of distance of data acquisition from the center of k-space.

15. The computer readable storage medium of claim 12 wherein the number of minimal-encoding pulses causes a delay in acquisition before the center of k-space sufficient to minimize eddy current and gradient driver hysteresis.

16. The computer readable storage medium of claim 12 wherein each minimal-encoding pulse has a zero amplitude.

17. The computer readable storage medium of claim 12 wherein each minimal-encoding pulse is one of a slice selective gradient pulse and a phase-encoding gradient pulse.

18. The computer readable storage medium of claim 11 wherein the set of instructions further causes the processor to sample the center of k-space at a faster rate than each peripheral region.

* * * * *